United States Patent
Dwyer et al.

(10) Patent No.: US 10,329,150 B2
(45) Date of Patent: Jun. 25, 2019

(54) FUEL CELL SYSTEM AND METHOD FOR DETERMINING PURITY LEVEL OF HYDROGEN GAS PROVIDED TO AN ANODE SIDE OF THE FUEL CELL

(71) Applicant: GM GLOBAL TECHNOLOGY OPERATIONS LLC, Detroit, MI (US)

(72) Inventors: William J. Dwyer, Royal Oak, MI (US); Jeffrey J. Gagliardo, Clarkston, MI (US); Pamela M. Vecasey, Davisburg, MI (US); Balasubramanian Lakshmanan, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 65 days.

(21) Appl. No.: 15/637,661

(22) Filed: Jun. 29, 2017

(65) Prior Publication Data
US 2019/0002279 A1  Jan. 3, 2019

(51) Int. Cl.
| | | |
|---|---|---|
| C01B 3/00 | (2006.01) | |
| C01B 3/50 | (2006.01) | |
| G01R 22/06 | (2006.01) | |
| H01M 8/1004 | (2016.01) | |

(52) U.S. Cl.
CPC ............. *C01B 3/50* (2013.01); *C01B 3/0078* (2013.01); *G01R 22/06* (2013.01); *H01M 8/1004* (2013.01)

(58) Field of Classification Search
CPC ......... H01M 8/04544; H01M 8/04552; H01M 8/04559; H01M 8/04574; H01M 8/04582; H01M 8/04589; H01M 8/04798
USPC .................................. 429/408, 428, 431, 432
See application file for complete search history.

(56) References Cited

U.S. PATENT DOCUMENTS

| | | | |
|---|---|---|---|
| 2015/0346140 A1* | 12/2015 | Kirk | H01M 8/0662 205/775 |
| 2017/0084941 A1 | 3/2017 | Cai et al. | |
| 2017/0170501 A1* | 6/2017 | Im | H01M 8/04089 |

FOREIGN PATENT DOCUMENTS

| | | | | |
|---|---|---|---|---|
| GB | 2526287 A | * | 11/2015 | ........ H01M 8/04992 |
| JP | 2006059745 A | * | 3/2006 | |

* cited by examiner

*Primary Examiner* — Sean P Cullen
(74) *Attorney, Agent, or Firm* — Cantor Colburn LLP

(57) ABSTRACT

A system and method for determining the purity level of hydrogen gas fuel provided to an anode side of a fuel cell stack, and then modifying models and algorithms used by the system based on the purity level. The method includes determining whether predetermined criteria have been met that are necessary to obtain an accurate hydrogen gas fuel purity level, and if so, comparing a measured voltage or current of the fuel cell stack to a modeled voltage or current of the fuel cell stack. If the comparison between the measured voltage or current and the modeled voltage or current is greater than a predetermined threshold, then the method adapts a hydrogen gas concentration value to a lower purity level to be used by downstream models.

20 Claims, 2 Drawing Sheets

FUEL CELL SYSTEM AND METHOD FOR DETERMINING PURITY LEVEL OF HYDROGEN GAS PROVIDED TO AN ANODE SIDE OF THE FUEL CELL

BACKGROUND OF THE INVENTION

Field of the Invention

This invention relates generally to a system and method for determining the purity of hydrogen gas fuel being provided to an anode side of a fuel cell stack and, more particularly, to a system and method for determining the purity of hydrogen gas fuel being provided to an anode side of a fuel cell stack, where the method includes comparing a measured fuel cell stack voltage or current to a modeled stack voltage or current value for pure hydrogen gas fuel, and adapting algorithms in the fuel cell system to the actual purity level of the fuel.

Discussion of the Related Art

A hydrogen fuel cell is an electro-chemical device that includes an anode and a cathode with an electrolyte therebetween. The anode receives hydrogen gas and the cathode receives oxygen or air. The hydrogen gas is dissociated in the anode to generate free hydrogen protons and electrons. The hydrogen protons pass through the electrolyte to the cathode. The electrons from the anode cannot pass through the electrolyte, and thus are directed through a load to perform work before being sent to the cathode. Proton exchange membrane fuel cells (PEMFC) are a popular fuel cell type for vehicles, and generally include a solid polymer electrolyte proton conducting membrane, such as a perfluorosulfonic acid membrane. The anode and cathode typically include finely divided catalytic particles, usually platinum (Pt), supported on carbon particles and mixed with an ionomer, where the catalytic mixture is deposited on opposing sides of the membrane. The combination of the anode catalytic mixture, the cathode catalytic mixture and the membrane define a membrane electrode assembly (MEA).

Several fuel cells are typically combined in a fuel cell stack to generate the desired power. A fuel cell stack typically includes a series of flow field or bipolar plates positioned between the several MEAs in the stack, where the bipolar plates and the MEAs are positioned between two end plates. The bipolar plates include an anode side and a cathode side for adjacent fuel cells in the stack. Anode gas flow channels are provided on the anode side of the bipolar plates that allow the anode reactant gas to flow to the respective MEA. Cathode gas flow channels are provided on the cathode side of the bipolar plates that allow the cathode reactant gas to flow to the respective MEA. One end plate includes anode gas flow channels, and the other end plate includes cathode gas flow channels. The bipolar plates and end plates are made of a conductive material, such as stainless steel or a conductive composite. The end plates conduct the electricity generated by the fuel cells out of the stack. The bipolar plates also include flow channels through which a cooling fluid flows.

Many fuel cell system control algorithms require knowing the concentration of hydrogen gas in the anode sub-system of the fuel cell system for various purposes, such as maintaining fuel cell stack stability, promoting a healthy start-up/shutdown sequence of the system, setting the injection frequency of hydrogen gas into the anode side from a hydrogen source, and initiating a hydrogen gas injection event to maintain hydrogen gas in the anode side during system off-time.

It is known to bleed anode exhaust gas when the concentration of hydrogen gas in the anode becomes too low. Particularly, the MEAs in the fuel cells are permeable and thus allow nitrogen in the air from the cathode side of the stack to permeate therethrough and collect in the anode side of the stack, often referred to as nitrogen cross-over. Even though the anode side pressure may be slightly higher than the cathode side pressure, cathode side partial pressures will cause air to permeate through the membrane. Nitrogen in the anode side of the fuel cell stack dilutes the hydrogen such that if the nitrogen concentration increases above a certain percentage, such as 50%, fuel cells in the stack may become starved of hydrogen. If a fuel cell becomes hydrogen starved, the fuel cell stack will fail to produce adequate electrical power and may suffer damage to the electrodes in the fuel cell stack. Thus, it is known in the art to provide a bleed valve in the anode exhaust gas output line of the fuel cell stack to remove nitrogen from the anode side of the stack. The fuel cell system control algorithms will identify a desirable minimum hydrogen gas concentration in the anode, and cause the bleed valve to open when the gas concentration falls below that threshold, where the threshold is based on stack stability.

It is possible to provide a gas concentration sensor at a strategic location in the fuel cell system, such as at the input or the output of the anode of the fuel cell stack, to measure the concentration of the particular gas, such as hydrogen. However, in order for these types of sensors to provide an accurate estimation of the gas in the hot and wet environment of a fuel cell system, the sensors are very expensive, and still are not fully reliable, thus rendering them ineffective for automotive fuel cell system applications.

It is known in the art to use a model to estimate the molar fraction of hydrogen, nitrogen and other gases in the anode side of a fuel cell stack to determine when to perform the bleed. For example, gas concentration estimation (GCE) models are known for estimating hydrogen, nitrogen, oxygen, water vapor, etc. in various volumes of a fuel cell system, such as the anode flow-field, anode plumbing, cathode flow-field, cathode header and plumbing, etc. Although the GCE models are fairly accurate in determining the hydrogen gas concentration in the anode side of the stack, certain stack operating conditions may affect the ability of the model to accurately calculate the hydrogen gas concentration.

The purity level of hydrogen gas fuel being provided to the anode side of a fuel cell stack has a direct impact on the performance of the stack. For example, the electro-chemical reaction in the fuel cells is very sensitive to carbon monoxide that could exist in the anode fuel. Further, inert gases, such as nitrogen and argon, in the anode fuel dilute the hydrogen gas, where the accuracy of the models predicting the hydrogen gas concentration may be affected. For example, the models employed to initiate the anode bleed events discussed above are based on the hydrogen gas fuel being at a very high purity level, where anode bleeds may be triggered to late if the model believes that the purity level of the hydrogen gas is higher than the actual purity of the hydrogen gas. The model that predicts the concentration of hydrogen gas could also cause various undesirable issues concerning durability and degradation of the fuel cell stack if the purity level of the hydrogen gas is not at the level that the model thinks that it is at. If the model knows the purity level of the hydrogen gas, then the model can be adjusted to account for less pure hydrogen gas, such as triggering a reactive bleed more often.

For automotive applications, SAE requirements define acceptable hydrogen gas purity levels where 99.97% of the fill gas is hydrogen. However, various impurities may be combined with the hydrogen gas from the fuel cell system refueling process, thus reducing its purity. These impurities can enter the anode fuel through various means, such as reformers in refueling stations. It has been shown that a 0.007% reduction in hydrogen purity is enough to cause a 20% error in system concentration, which could lead to anode starvation and increased stack degradation.

SUMMARY OF THE INVENTION

The present invention discloses and describes a system and method for determining the purity level of hydrogen gas fuel provided to an anode side of a fuel cell stack, and then modifying models and algorithms used by the system based on the purity level. The method includes determining whether predetermined criteria have been met that are necessary to obtain an accurate hydrogen gas fuel purity level, and if so, comparing a measured voltage or current of the fuel cell stack to a modeled voltage or current of the fuel cell stack. If the comparison between the measured voltage or current and the modeled voltage or current is greater than a predetermined threshold, then the method adapts a hydrogen gas concentration value to a lower purity level to be used by downstream models.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for determining the purity level of hydrogen gas fuel provided to an anode side of a fuel cell stack is merely exemplary in nature, and is in no way intended to limit the invention or its applications or uses. For example, the discussion herein refers to the fuel cell system is on a vehicle. However, the fuel cell system may be applicable for other devices and apparatuses.

Figure 1:
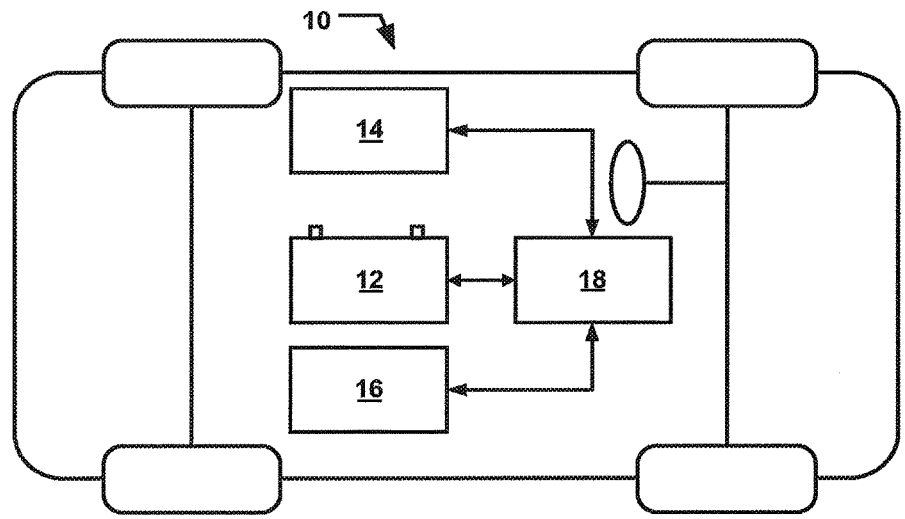
FIG. 1 is an illustration of a vehicle including a fuel cell system.

FIG. 1 is a simplified view illustrating a hybrid fuel cell vehicle 10 that includes a high-voltage battery 12, a fuel cell stack 14, a propulsion unit 16 and a controller 18. The controller 18 represents all of the control modules, processors, electronic control units, memories and devices necessary for the operation and calculations that determine the purity level of hydrogen gas in the anode sub-system as discussed herein, and using that information in various system control models.

Figure 2:
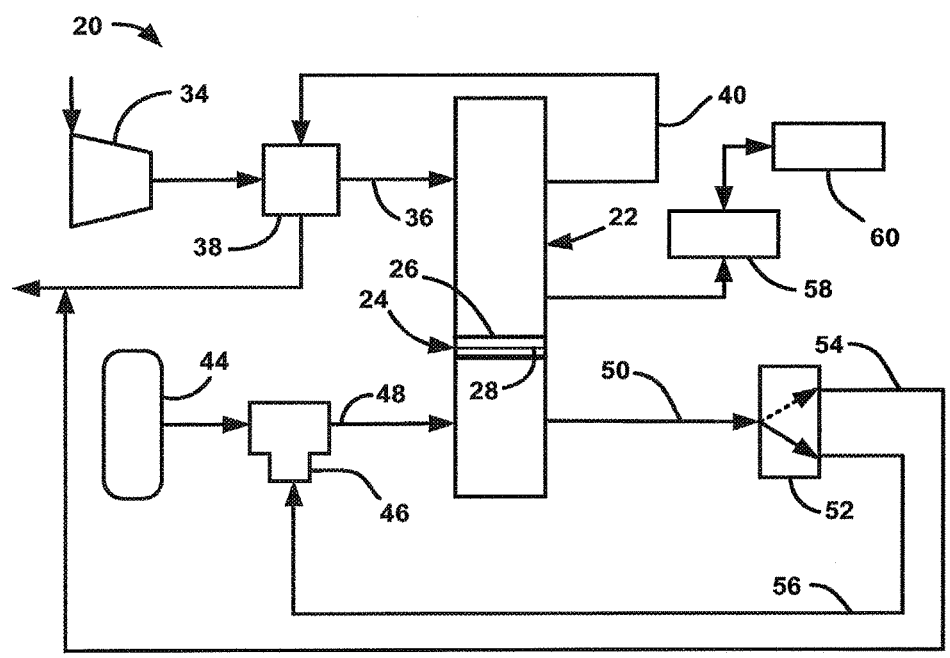
FIG. 2 is a simplified schematic block diagram of a fuel cell system.

FIG. 2 is a schematic block diagram of a fuel cell system 20 including a fuel cell stack 22, where the fuel cell system 20 has particular application for use on the vehicle 10. The fuel cell stack 22 includes a series of fuel cells of the type discussed above, represented generally by a fuel cell 24 including opposing bipolar plates 26 having an MEA 28 therebetween. A compressor 34 provides an airflow to the cathode side of the fuel cell stack 22 on a cathode input line 36 through a water vapor transfer (WVT) unit 38 that humidifies the cathode input air. A cathode exhaust gas is output from the fuel cell stack 22 on a cathode exhaust gas line 40 that directs the cathode exhaust gas to the WVT unit 38 to provide the humidity to humidify the cathode input air. The fuel cell system 20 also includes a source 44 of hydrogen gas fuel, typically a high pressure tank, that provides hydrogen gas to an injector 46 that injects a controlled amount of the hydrogen gas to the anode side of the fuel cell stack 22 on an anode input line 48. Although not specifically shown, one skilled in the art would understand that various pressure regulators, control valves, shut-off valves, etc. would be provided to supply the high pressure hydrogen gas from the source 44 at a pressure suitable for the injector 46. The injector 46 can be any injector suitable for the purposes discussed herein many of which are known to those skilled in the art.

An anode effluent gas is output from the anode side of the fuel cell stack 22 on an anode output line 50, which is provided to a bleed valve 52. As discussed above, nitrogen cross-over from the cathode side of the fuel cell stack 22 dilutes the hydrogen gas in the anode side of the fuel cell stack 22, thereby affecting fuel cell stack performance. Therefore, it is necessary to periodically bleed the anode effluent gas from the anode sub-system to reduce the amount of nitrogen in the anode sub-system. When the fuel cell system 20 is operating in a normal non-bleed mode, the bleed valve 52 is in a position where the anode effluent gas is provided to a recirculation line 56 that recirculates the anode gas to the injector 46 to operate it as an ejector or pump to provide recirculated hydrogen gas back to the anode input of the fuel cell stack 22. When a bleed is commanded to reduce the nitrogen in the anode side of the fuel cell stack 22, the bleed valve 52 is positioned to direct the anode effluent gas to a by-pass line 54 that combines the anode effluent gas with the cathode exhaust gas on the line 40, where the hydrogen gas is diluted to be suitable for the environment.

The fuel cell system 20 also includes a voltage and/or current monitoring device 58 that can do one or more of monitor the overall stack voltage, monitor the individual voltages of each fuel cell 24 in the fuel cell stack 22, and measure the current density of the fuel cell stack 22 at any particular point in time. All fuel cell systems include techniques for monitoring the voltage and current of a fuel cell stack and, as would be appreciated by those skilled in the art, any such suitable technique can be employed herein. The fuel cell system 20 also includes a controller 60 that controls the various operations discussed herein.

As will be discussed in detail below, the present invention proposes a system and method for determining the purity level of hydrogen gas provided to the anode side of the fuel cell stack 22, and then uses that purity level to adapt system models and algorithms.

Figure 3:
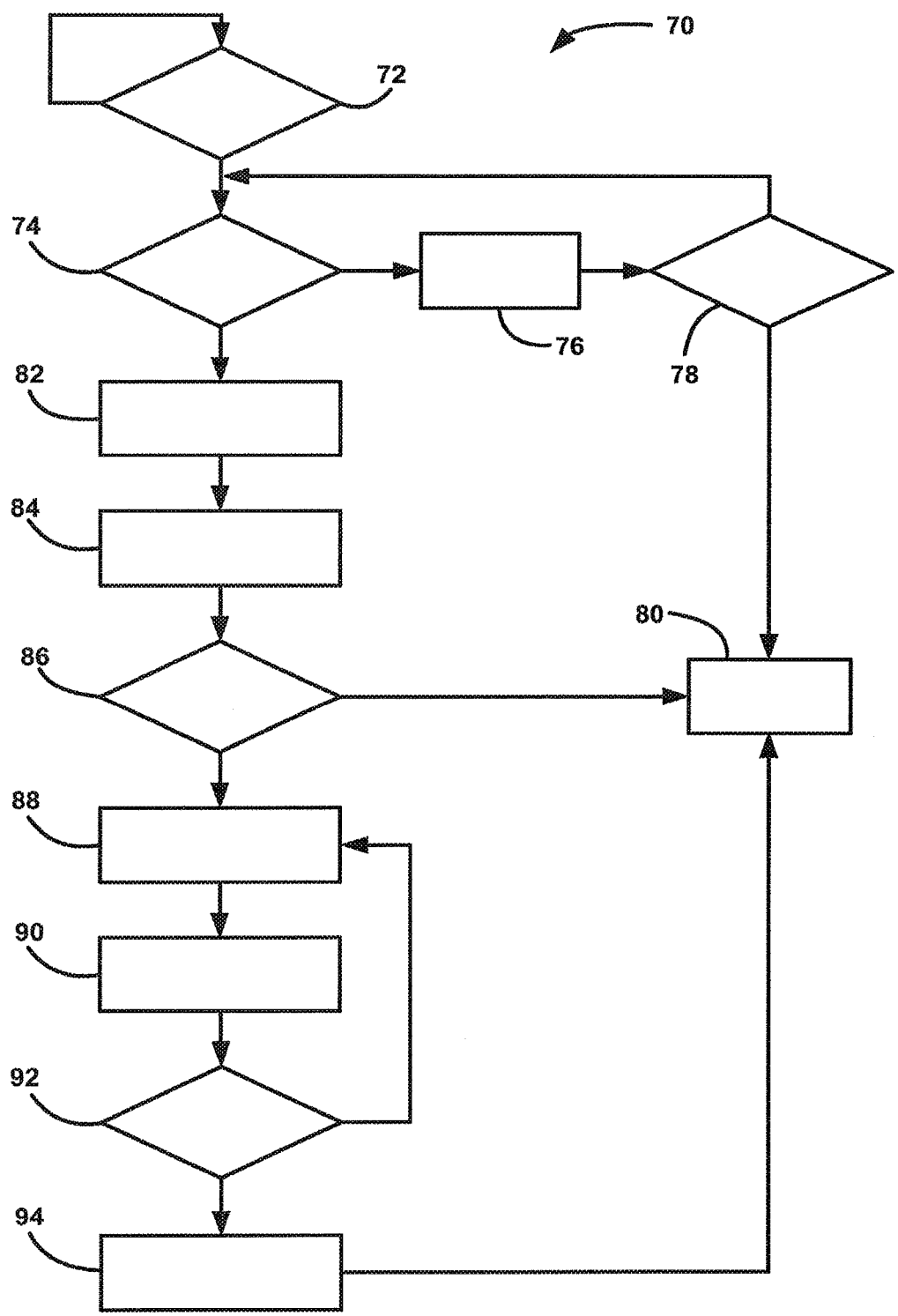
FIG. 3 is a flow chart diagram showing a process for determining the purity level of hydrogen gas provided to an anode side of a fuel cell stack.

FIG. 3 is a flow chart diagram 70 showing a process for determining the purity level of a hydrogen gas fuel provided to the anode side of the fuel cell stack 22, and providing remedial actions based on the determined purity level if the purity level is below a certain "pure" threshold. The algorithm continually monitors for a hydrogen gas refueling event that fills the hydrogen source 44 in the fuel cell system 20 at decision diamond 72. If a refueling event is detected at the decision diamond 72, then the algorithm determines if certain criteria have been met at decision diamond 74 that are necessary in order to provide an accurate determination of the purity level of the hydrogen gas fuel that has just been provided to the source 44, as discussed in further detail below. The criteria required at the decision diamond 74 basically determine whether the fuel cell system 20 is operating properly in a normal mode, where no faults are detected. The criteria can include that the stack current density has been high enough for a long enough period of time, the fuel cell stack 22 is at a proper operating temperature, pressure and humidification, the cathode and anode reactant gas flows are proper, the injector 46 is operating properly, etc. If all of the criteria have not been met at the decision diamond 74, then the algorithm goes to box 76 to wait some predetermined period of time and increments a timer clock. The algorithm then determines whether the timer clock has exceeded a maximum value at the decision diamond 78, and if not, returns to the decision diamond 74 to see if the requirements have now been met. If the maximum time count has been exceeded at the decision diamond 78, then the algorithm exits at box 80, and sets an appropriate flag indicating that the purity level of the hydrogen gas was not able to be obtained.

If the algorithm determines that that all of the criteria have been met at the decision diamond 74, then the algorithm obtains a measurement of the stack voltage and/or stack current density at box 82 from the monitoring device 58 and obtains a voltage or current output of a model at box 84 that is continually operating in the controller 60 that identifies the performance of the fuel cell stack 22 based on the stack voltage and/or stack current. This model is being continually adapted over time as the fuel cell system ages to determine if there are any stack degradation issues. Those skilled in the art will readily recognize suitable models that calculate the stack voltage and/or current density as discussed herein. The algorithm then compares the measured stack voltage and/or current density to the modeled stack voltage and/or stack current density at decision diamond 86, and if the difference is within a predetermined acceptable limit, i.e., does not exceed a threshold, then the algorithm knows that the hydrogen gas fuel is at an acceptable or high purity level and the process exits at the box 80.

If the measured stack voltage or stack current density is not within the acceptable limit of the modeled stack voltage or stack current density at the decision diamond 86, then the algorithm knows that there is a low purity issue with the just supplied hydrogen gas fuel. The algorithm then adapts the actual lower purity level of the hydrogen gas fuel provided to any downstream models operating in the fuel cell system 20 at box 88 so that those models give accurate information based on that purity level. In the known systems prior to the invention, those downstream models would adapt to the effects of a less pure hydrogen gas over time, however, the models would not know that it is the lower purity level of the hydrogen gas fuel that is providing the reason why the model needs to be adapted. Various models are known to those skilled in the art to determine hydrogen gas concentration in a fuel cell system that would be suitable for this process, see, for example, US Patent Application Publication No. 2017/0084941, titled, Validation and Correction of Gen 2 Anode H2 Concentration Estimation.

Once the adapted concentration of the hydrogen gas fuel has been determined at the box 88, then the algorithm compares the adapted concentration to the concentration of the hydrogen gas fuel determined by a gas concentration estimation (GCE) model at box 90, and the difference between the two concentration values are compared at box 92, where if the difference between the concentration values is greater than a predetermined threshold, the algorithm returns to the box 88 to further adapt the concentration value of the impure hydrogen gas fuel to make it closer to the concentration of the hydrogen gas fuel as determined by the GCE model. Once the adapted concentration of the hydrogen gas using the new purity level has been corrected enough that it is about the same as the concentration provided by the GCE model at the decision diamond 92, then the other models do not need to be further adapted because the determination of the concentration of the hydrogen gas fuel using the new purity level is now accurate. If the difference between the concentrations is within the threshold at the decision diamond 92, then the algorithm uses the lower purity level of the hydrogen gas fuel in a hydrogen storage system (HSS) tank concentration model at box 94, and the algorithm exits at the box 80. Suitable HSS tank concentration models, such as simple ideal gas law models, would be well known to those skilled in the art for this purpose.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining a purity level of hydrogen gas being provided to an anode side of a fuel cell stack, said method comprising:
    determining whether predetermined criteria have been met that are necessary to obtain an accurate hydrogen gas purity level;
    comparing a measured voltage of the fuel cell stack to a modeled voltage of the fuel cell stack based on the predetermined criteria having been met; and
    adapting a hydrogen gas concentration value to a lower purity level based on a difference between the measured voltage of the fuel cell stack and the modeled voltage of the fuel cell stack being greater than a predetermined threshold.

2. The method according to claim 1 further comprising using the adapted hydrogen gas concentration value in a plurality of downstream models.

3. The method according to claim 1 further comprising applying a hydrogen gas supply value to a hydrogen storage system (HSS) tank concentration model.

4. The method according to claim 1 wherein the determining whether predetermined criteria have been met includes monitoring a time period if the predetermined criteria have not been met, and determining that the purity level of the hydrogen gas cannot be determined if a predetermined time threshold has been exceeded.

5. The method according to claim 1 wherein the determining whether predetermined criteria have been met includes determining that the fuel cell stack is operating properly in a normal mode.

6. The method according to claim 5 wherein the predetermined criteria include determining that the fuel cell stack is at a proper temperature, pressure and humidification and determining that cathode and anode reactant gas flows are proper and a hydrogen gas injector is operating properly.

7. The method according to claim 1 further comprising comparing the adapted hydrogen gas concentration value to a modeled hydrogen gas concentration, and further adapting the hydrogen gas concentration value if a difference between the adapted hydrogen gas concentration value and the modeled value exceeds a predetermined threshold.

8. The method according to claim 7 wherein the modeled hydrogen gas concentration is obtained by a gas concentration estimation model.

9. A method for determining a purity level of hydrogen gas being provided to an anode side of a fuel cell stack, said method comprising:
    determining whether predetermined criteria have been met that are necessary to obtain an accurate hydrogen gas purity level;
    comparing a measured current of the fuel cell stack to a modeled current of the fuel cell stack based on the predetermined criteria having been met; and
    adapting a hydrogen gas concentration value to a lower purity level based on a difference between the measured current of the fuel cell stack and the modeled current of the fuel cell stack being greater than a predetermined threshold.

10. The method according to claim 9 further comprising using the adapted hydrogen gas concentration value in a plurality of downstream models.

11. The method according to claim 9 further comprising applying a hydrogen gas supply value to a hydrogen storage system (HSS) tank concentration model.

12. The method according to claim 9 wherein the determining whether predetermined criteria have been met includes monitoring a time period if the predetermined criteria have not been met, and determining that the purity level of the hydrogen gas cannot be determined if a predetermined time threshold has been exceeded.

13. The method according to claim 9 wherein the determining whether predetermined criteria have been met includes determining that the fuel cell stack is operating properly in a normal mode.

14. The method according to claim 13 wherein the predetermined criteria include determining that the fuel cell stack is at a proper temperature, pressure and humidification and determining that cathode and anode reactant gas flows are proper and a hydrogen gas injector is operating properly.

15. The method according to claim 9 further comprising comparing the adapted hydrogen gas concentration value to a modeled hydrogen gas concentration, and further adapting the hydrogen gas concentration value if a difference between the adapted hydrogen gas concentration value and the modeled value exceeds a predetermined threshold.

16. The method according to claim 15 wherein the modeled hydrogen gas concentration is obtained by a gas concentration estimation model.

17. A system for determining a purity level of hydrogen gas being provided to an anode side of a fuel cell stack, said system comprising:
    a controller programmed to determine whether predetermined criteria have been met that are necessary to obtain an accurate hydrogen gas purity level; and comparing a measured voltage of the fuel cell stack to a modeled voltage of the fuel cell stack if the predetermined criteria have been met; and
    wherein the controller is programmed to adapt a hydrogen gas concentration value to a lower purity level if a difference between the measured voltage of the fuel cell stack and the modeled voltage of the fuel cell stack is greater than a predetermined threshold.

18. The system according to claim 17 wherein the controller is capable of determining whether predetermined criteria have been met includes means for monitoring a time period if the predetermined criteria have not been met, and determining that the purity level of the hydrogen gas cannot be determined if a predetermined time threshold has been exceeded.

19. The system according to claim 17 wherein the controller is capable of determining that the fuel cell stack is operating properly in a normal mode.

20. The system according to claim 19 wherein the predetermined criteria include determining that that the stack is at a proper temperature, pressure and humidification and determining that cathode and anode reactant gas flows are proper and a hydrogen gas injector is operating properly.

* * * * *